United States Patent [19]
Ramdani et al.

[11] Patent Number: 5,923,696
[45] Date of Patent: Jul. 13, 1999

[54] VISIBLE LIGHT EMITTING VERTICAL CAVITY SURFACE EMITTING LASER WITH GALLIUM PHOSPHIDE CONTACT LAYER AND METHOD OF FABRICATION

[75] Inventors: Jamal Ramdani, Gilbert; Michael S. Lebby, Apache Junction; Philip Kiely, Gilbert, all of Ariz.

[73] Assignee: Motorola, Inc., Schaumburg, Ill.

[21] Appl. No.: 08/774,822

[22] Filed: Dec. 27, 1996

[51] Int. Cl.⁶ ...................................................... H01S 3/19
[52] U.S. Cl. ................................................ 372/96; 372/50
[58] Field of Search ................................. 372/45, 96, 99, 372/46, 50; 438/32

[56] References Cited

U.S. PATENT DOCUMENTS

| | | | |
|---|---|---|---|
| 5,351,256 | 9/1994 | Schneider et al. | 372/99 |
| 5,363,390 | 11/1994 | Yang et al. | 372/45 |
| 5,530,715 | 6/1996 | Shieh et al. | 372/45 |
| 5,621,748 | 4/1997 | Kondo et al. | 372/46 |
| 5,661,075 | 8/1997 | Grodzinski et al. | 438/32 |
| 5,679,964 | 10/1997 | Kobayashi et al. | 372/50 |

*Primary Examiner*—Rodney Bovernick
*Assistant Examiner*—Yisun Song
*Attorney, Agent, or Firm*—William E. Koch

[57] ABSTRACT

A stack of distributed Bragg reflectors is disposed on the surface of a semiconductor substrate. The stack includes a plurality of alternating layers of material having alternating refractive indexes with the stack having a first dopant type. A first cladding region is disposed on the stack with an active area disposed on the first cladding region. The active area includes at least two barrier layers and a quantum well layer. A second cladding region is disposed on the active area with a stack of distributed Bragg reflectors disposed on the cladding region. A contact region is disposed on the second stack of distributed Bragg reflectors. The contact region includes a magnesium doped gallium phosphide material.

24 Claims, 1 Drawing Sheet

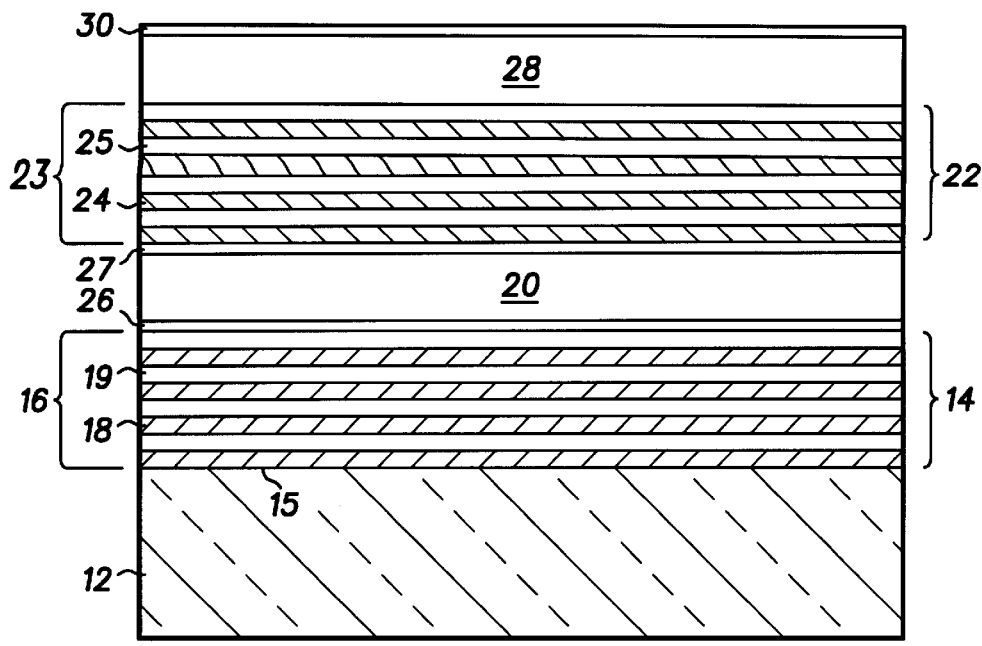
FIG. 1 - PRIOR ART -
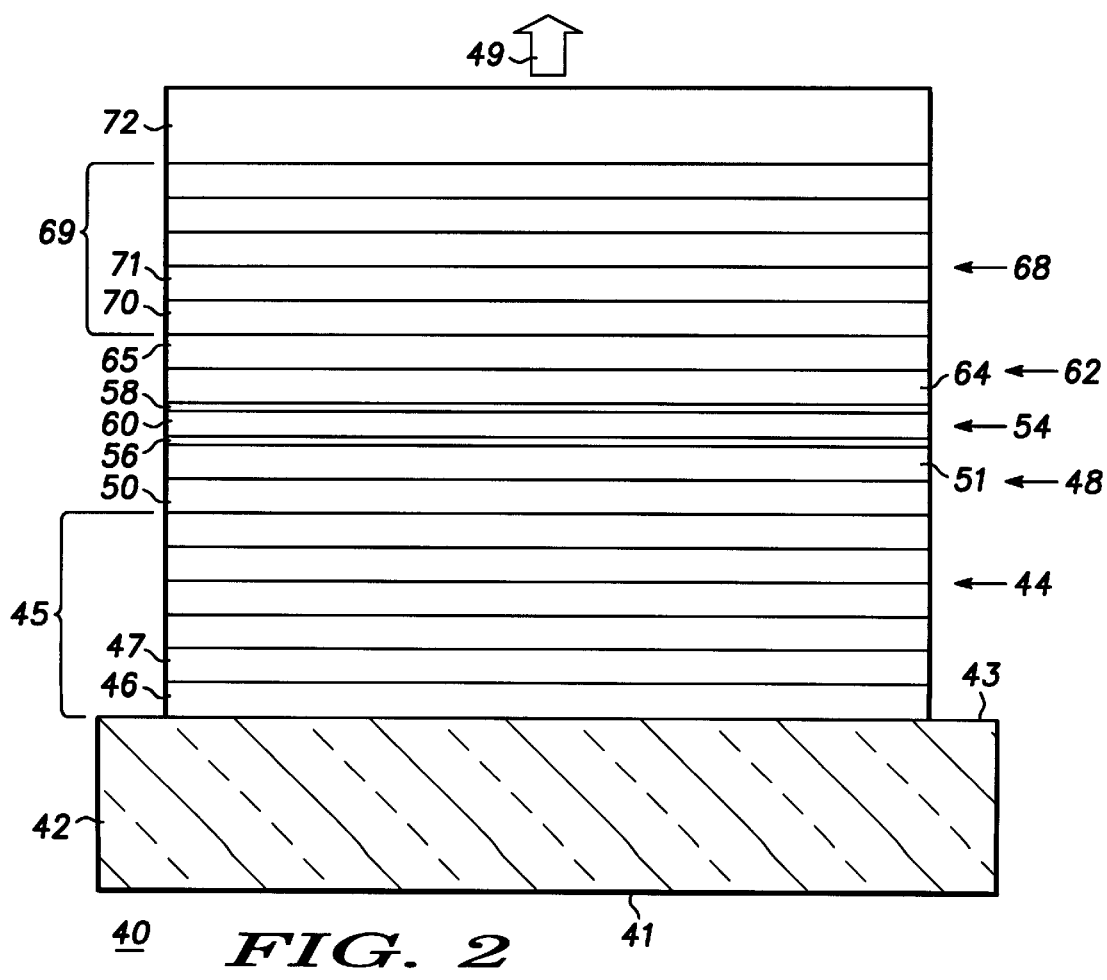
FIG. 2

5,923,696

VISIBLE LIGHT EMITTING VERTICAL CAVITY SURFACE EMITTING LASER WITH GALLIUM PHOSPHIDE CONTACT LAYER AND METHOD OF FABRICATION

FIELD OF THE INVENTION

The present invention pertains to semiconductor lasers, and, more particularly, to vertical cavity surface emitting lasers.

BACKGROUND OF THE INVENTION

At present, conventional edge emitting semiconductor lasers play a significant role in optical communication due to their high operating efficiency and modulation capabilities, however, edge emitting semiconductor lasers have several short comings or problems, thus making them difficult to use in several applications.

Recently, there has been an increased interest in vertical cavity surface emitting lasers (VCSELs). The conventional VCSEL has several advantages, such as emitting light perpendicular to the surface of the die, and the possibility of fabrication of two dimensional arrays. However, while conventional VCSELs have several advantages, they also have several disadvantages with regard to emission in the visible spectrum primarily due to the poor reflectivity of the distributed Bragg reflectors which are contained as a part of the VCSEL structure and degradation of structural materials during the fabrication process. Because of this, manufacturability of VCSELs for the visible spectrum is severely limited.

Short wavelength laser diodes are of great interest for high density optical data storage, medical applications, etc. With the emergence of digital video disk (DVD) technology which utilizes visible wavelength semiconductor lasers for data storage, the market demand for both 635 nm and 650 nm semiconductor lasers is expected to soon catch up with the demand for the now common 780 nm compact disk (CD) lasers.

A typical structure of a now existing vertical cavity surface emitting laser is illustrated in FIG. 1 and labeled prior art. Specifically, illustrated is a simplified cross-sectional view of a portion of a vertical cavity surface emitting laser 10. Vertical cavity surface emitting laser 10 is fabricated on a semiconductor substrate 12, more particularly a gallium arsenide substrate. A first stack of distributed Bragg reflectors 14, comprised of a plurality of alternating layers 16 is positioned on a surface 15 of semiconductor substrate 12. The plurality of alternating layers 16 of first stack of distributed Bragg reflectors arsenide material and a n-doped gallium aluminum arsenide material. There is next fabricated a cladding region 26, on a surface of first stack of distributed Bragg reflectors 14, an active region 20 disposed on cladding region 26, and a cladding region 27 disposed on a surface of active region 20. A second stack of distributed Bragg reflectors 22 is positioned on a surface of cladding region 27. Second stack of distributed Bragg reflectors 22 is formed of a plurality of alternating layers 23, more specifically alternating layers 24 and 25 of a p-doped aluminum arsenide and a p-doped gallium aluminum arsenide. Second stack of distributed Bragg reflectors 22 is followed by a one-half wavelength aluminum gallium arsenide contact layer 28. Contact layer 28 is p-doped to 1E19 cm$^{-3}$ or higher. Finally, a very thin gallium arsenide cap layer 30 is positioned on a surface of contact layer 28. Cap layer 30 is very thin, more specifically on the order of 100 Å thick. Cap layer 30 is p-doped to 1E19 cm$^{-3}$ or higher.

There exist several drawbacks to this type of vertical cavity surface emitting laser, more particularly VCSEL 10. Of particular concern is one-half wavelength contact layer 28. As stated, contact layer 28 in this particular embodiment is fabricated of aluminum gallium arsenide. More specifically, contact layer 28 is fabricated to include approximately fifty percent aluminum. Aluminum is a wide band gap material and very difficult to dope to a level of 1E19 cm$^{-3}$ with zinc or carbon. While doping of contact layer 28 with zinc or carbon can be achieved at growth temperatures around 550° C.–600° C., at this extreme temperature, the quality of contact layer 28 degrades rapidly due to the oxygen incorporation. Another drawback to contact layer 28 is that only a thin layer of gallium arsenide in cap layer 30, more particularly a layer of 100 Å or less, protects the surface of contact layer 28. Cap layer 30 can be easily removed and/or damaged during the process of fabrication of VCSEL 10 which results in a rapid oxidation of VCSEL 10 structure, including contact layer 28, second stack of distributed Bragg reflectors 22 structure, active region 20 and first stack of distributed Bragg reflectors 14 structure.

Thus, there is a need for developing visible light emitting vertical cavity surface emitting laser (VCSEL) for use in high density DVD technologies that includes an easily doped contact layer, thereby maintaining structural integrity of the VCSEL device.

Accordingly, it is highly desirable to provide for a visible light emitting vertical cavity surface emitting laser (VCSEL) for use in high density DVD technologies that includes the fabrication of a VCSEL structure on a semiconductor substrate and includes a one-half wavelength contact layer within the VCSEL structure that is easily p-doped to a level of 1E19 cm$^{-3}$ or higher.

It is a purpose of the present invention to provide a new and improved vertical cavity surface emitting laser that utilizes a gallium phosphide contact layer, thereby capable of being easily p-type doped with a material such as magnesium, zinc, or a combination of magnesium and zinc without damage to the underlying VCSEL structure.

It is a further purpose of the present invention to use a gallium phosphide contact layer, as part of a VCSEL structure that further serves as a passivation layer.

It is a still further purpose of the present invention to provide for a new and improved vertical cavity surface emitting laser that is capable of emission in the visible spectrum.

SUMMARY OF THE INVENTION

The above problems and others are substantially solved and the above purposes and others are realized in visible light emitting vertical cavity surface emitting laser that includes a supporting substrate having a surface, a first stack of distributed Bragg reflectors disposed on the surface of the supporting substrate, a first cladding region disposed on the first stack of distributed Bragg reflectors, an active region disposed on the first cladding region, a second cladding region disposed on the active region, a second stack of distributed Bragg reflectors disposed on the second cladding region, and a one-half wavelength contact layer disposed on the second stack of distributed Bragg reflectors. The first stack of distributed Bragg reflectors and the second stack of distributed Bragg reflectors are comprised of a plurality of pairs of alternating layers.

In addition, disclosed is a method of fabricating a visible light emitting vertical cavity surface emitting laser including the steps of providing a semiconductor supporting substrate having a surface, disposing a first stack of distributed Bragg reflectors on the surface of the semiconductor substrate, disposing a first cladding layer on the first stack of distributed Bragg reflectors, disposing an active region on the first cladding layer, disposing a second cladding layer on the active region, disposing a second stack of distributed Bragg reflectors on the second cladding layer, and disposing a one-half wavelength contact layer of a gallium phosphide material on the second stack of distributed Bragg reflectors. The method further includes forming the first stack of distributed Bragg reflectors to include pairs of alternating layers and positioning the pairs of alternating layers adjacent the surface of the semiconductor supporting substrate and forming the second stack of distributed Bragg reflectors to include pairs of alternating layers, and positioning the pairs of alternating layers adjacent a surface of the second cladding layer.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

FIG. 1 is an enlarged simplified cross-sectional view of a prior art vertical cavity surface emitting laser device; and FIG. 2 is an enlarged simplified cross-sectional view of the structure of a visible light emitting vertical cavity surface emitting laser in accordance with the present invention.

DETAILED DESCRIPTION OF THE PREFERRED EMBODIMENT

During the course of this description, like numbers are used to identify like elements according to the different figures that illustrate the invention. Referring now to FIG. 2 illustrated in an enlarged simplified cross-sectional view is a vertical cavity surface emitting laser (VCSEL) 40 formed on a supporting substrate 42 having surfaces 41 and 43 with light 49 being emitted by VCSEL 40. It should be understood that while FIG. 2 only illustrates a portion of a single VCSEL 40, VCSEL 40 may represent many VCSELs that are located on substrate 42 to form arrays.

Generally, as shown in FIG. 2, VCSEL 40 is made of several defined areas, such as a stack 44 of distributed Bragg reflectors having a plurality of alternating layers 45 with alternating refractive indexes, illustrated by layers 46 and 47, a cladding region 48 having layers 50 and 51, active area 54 having a plurality of barrier layers 56 and 58 and a quantum well layer 60, a cladding region 62 having layers 64 and 65, a stack 68 of distributed Bragg reflectors having a plurality of alternating layers 69 with alternating refractive indexes, illustrated by layers 70 and 71, and a contact region 72.

It should be understood that FIG. 2 is a simplified illustration and that many elements have been purposely omitted to more clearly illustrate the present invention. It should be further understood that VCSEL 40 represents any suitable VCSEL, such as a ridge VCSEL, a planar VCSEL, or the like. Additionally, it should be understood that VCSEL 40 can be formed by any suitable method to shape emitted light (arrow 49) into a variety of geometric patterns, such as a square, a circle, a triangle, or the like.

Substrate 42 is made of any suitable material, such as a semiconductive material, e.g., gallium arsenide, silicon, gallium indium phosphide, or the like. Typically, substrate 42 is made of gallium arsenide so as to facilitate epitaxial growth and lattice matching of subsequent layers that comprise VCSEL 40. Surface 43 of substrate 42 can be used to form a contact (not shown) which is electrically coupled to stack 44 of distributed Bragg reflectors. The contact is typically formed by applying any suitable conductive material, such as a metal, e.g., gold, platinum, silver, an alloy, e.g., germanium gold alloy, or the like to surface 43, or in some applications to surface 41, and annealing the conductive material with substrate 42. However, it should be understood that there are other alternative methods that can be used to electrically couple stack 44 of distributed Bragg reflectors, such as directly coupling to stack 44. The alternative methods can be achieved by combining several processing steps, such as photolithography, etching, and metallization, and the like.

Generally, any suitable epitaxial deposition method, such as molecular beam epitaxy (MBE), metal organic chemical vapor deposition (MOCVD), or the like is used to make the multiple layers such as, stacks 44 and 68 of distributed Bragg reflectors, cladding regions 48 and 62, active area 54, and contact region 72 of VCSEL 40. These methods allow for the epitaxial deposition of material layers, such as indium aluminum gallium phosphide, indium gallium phosphide, aluminum arsenide, aluminum gallium arsenide, indium aluminum phosphide, and the like.

Stack 44 of distributed Bragg reflectors is epitaxially deposited on surface 43 of substrate 42 with subsequent depositions defining cladding region 48, active area 54, cladding region 62, stack 68 of distributed Bragg reflectors, and contact region 72. Thicknesses of alternating layers 46, 47, 70 and 71 are set as portions of a wavelength of light (arrow 49) that VCSEL 40 is designed to emit. Thus, specific thicknesses of the alternating layers 46, 47, 70, and 71 are a function of the designed wavelength at which VCSEL 40 is designed to operate. However, in general, the thickness that is most commonly used is one quarter, one half, three quarters, full wavelength, or any multiples thereof. In a preferred embodiment of the present invention, thicknesses of one quarter wavelength are used for alternating layers of stacks 44 and 68 of distributed Bragg reflectors, illustrated by layers 46, 47, and layers 70 and 71, respectively. Generally, the plurality of alternating layers 45 of stack 44 of distributed Bragg reflectors and alternating layers 69 of stack 68 are from one pair to fifty mirror pairs, with a preferred number of mirror pairs ranging from thirty to fifty pairs. However, it should be understood that the number of mirror pairs can be adjusted for specific applications.

Generally, doping of stacks 44 and 68 of distributed Bragg reflectors is split, with one of the stacks being N-type and the other being P-type. Any suitable N-type dopants, such as silicon, selenium, or the like and P-type dopants, such as carbon, zinc or the like can be use to dope portions of VCSEL 40. Since doping levels are well known in the art, the doping levels will not be described herein other than to identify material either as undoped, P-type doped, or N-type doped. Briefly, stack 44 of distributed Bragg reflectors and layer 50 of cladding region 48 are N-type doped with stack 68 of distributed Bragg reflectors, layer 65 of cladding region 62, and contact region 72 being P-typed doped. Layers 51 and 64 of cladding regions 48 and 62, respectively, and active area 54 are undoped.

In the present invention, stacks 44 and 68 of distributed Bragg reflectors having alternating layers 46 and 47, 70 and 71 are made of any suitable materials, such as aluminum gallium arsenide and aluminum arsenide (e.g., $Al_{.5}Ga_{.5}As/$ AlAs), indium aluminum gallium phosphide and aluminum arsenide (e.g., In.$_{49}$(AlGa).$_{51}$P/AlAs), and indium aluminum gallium phosphide and indium aluminum phosphide (e.g., In.$_{49}$(AlGa).$_{51}$P/In.$_{49}$Al.$_5$P), which are epitaxially disposed or deposited on or overlaying substrate 42, thereby generating stacks 44 and 68 of distributed Bragg reflectors. It should be understood that the alternating layers 46 and 47 and the alternating layers 70 and 71 are formed such that alternating layers 46 and 47 have differing refractive indexes and that alternating layers 70 and 71 also differ in their refractive indexes. However, generally, stacks 44 and 68 of distributed Bragg reflectors are based on the same materials. For example, if stack 44 of distributed Bragg reflectors uses aluminum gallium arsenide and aluminum arsenide for alternating layers 46 and 47, then the alternating layer 70 and 71 of stack 68 of distributed Bragg reflectors will use aluminum gallium arsenide and aluminum arsenide. Thus, while the refractive indexes of layers 46 and 47 differ and the refractive indexes of layers 70 and 71 differ, layers 46 and 47 may be made of the same material and layers 70 and 71 may be made of the same materials. Additionally, it should be understood that in the examples contained within this description where a percent composition of a particular element is given it should be considered only as an example. It should be further understood that variations from these examples can be large and are part of the present invention.

As shown in FIG. 2 cladding region 48 is made of at least two components that are epitaxially disposed or deposited on stack 44 of distributed Bragg reflectors. First, layer 50, made of any suitable material, such as indium aluminum gallium phosphide (InAlGaP), indium aluminum phosphide (InAlP), or the like, is epitaxially deposited on stack 44 of distributed Bragg reflectors. Layer 50 is made having an appropriate thickness and being doped similarly to stack 44 of distributed Bragg reflectors. Second, layer 51, made of any suitable material, such as indium aluminum gallium phosphide (InAlGaP), or the like, having an appropriate thickness and being undoped, is epitaxially deposited on layer 50.

For example, layer 50 of indium aluminum gallium phosphide is epitaxially deposited on stack 44 of distributed Bragg reflectors. Layer 50 is n-type doped with any suitable dopant such as silicon, selenium, or the like similar to stack 44. Second, layer 51 of indium aluminum gallium phosphide is epitaxially deposited on layer 50. Layer 51 is undoped. The thickness of layers 50 and 51 is determined by the wavelength of light (arrow 49) that is to be emitted from VCSEL 40, thereby allowing the thickness of layers 50 and 51 to be any appropriate thickness.

Active area 54, as shown in FIG. 2, is represented by a single layer which is epitaxially deposited or disposed on cladding region 48; however, active area 54 is more clearly defined as including a plurality of layers. More specifically, active area 54 includes barrier layers 56 and 58 and a quantum well layer 60. It should be understood that active area 54 can be designed with any number of quantum wells and barrier layers, and can be as simple as a single quantum well layer positioned between two barrier layers as described.

In the present invention, quantum well layer 60 is made of undoped indium gallium phosphide (e.g., In$_{1-x}$Ga$_x$P) with barrier layers 56 and 58 being made of undoped indium aluminum gallium phosphide (e.g., In$_{0.5}$(AlGa)$_{0.5}$P) thereby causing VCSEL 40 to emit light (arrow 49) in the visible spectrum, as well as allowing VCSEL 40 to operate at elevated temperatures. Percent concentrations of aluminum and gallium that make up the indium aluminum gallium phosphide layer of barrier layers 56 and 58 can range from 48 to 52 percent with a preferred composition of 51 percent. In the indium gallium phosphide of quantum well layer 60 the percent concentration of gallium (x) can range from 40 to 51 percent, with a preferred range from 42 to 45 percent, and a nominal value or 43 percent.

As shown in FIG. 2, cladding region 62 includes layers 64 and 65 that are disposed or deposited epitaxially on active area 54. First, layers 64 and 65 are made of any suitable cladding material, with reference to cladding region 62, that is epitaxially deposited to an appropriate thickness.

By way of example, layer 64 is formed of undoped indium aluminum gallium phosphide (In.$_{49}$Al$_x$Ga.$_{51-x}$P) that is epitaxially deposited on active area 54. Generally, the undoped indium aluminum gallium phosphide has a thickness that is determined by the wavelength of light that is to be emitted from the VCSEL 40. Subsequently, layer 65 is formed of doped indium aluminum phosphide (In.$_{49}$Al.$_{51}$P) that is epitaxially deposited on undoped layer 64. In accordance with the previous example, doping for layer 65 is with a p-type dopant.

Generally, cladding regions 48 and 62 and active area 54 are combined to provide a thickness that is approximately one wavelength of light (arrow 49) emitted from VCSEL 40. However, the thickness of cladding regions 48 and 62 and active area 54 can be any suitable integer multiple of the wavelength of emitted light. Additionally, it should be understood that thicknesses are symmetrical, i.e., the thickness of layer 50 is equal to that of layer 65 and the thickness of layer 51 is equal to that of layer 64. Additionally, the thickness of barrier layers 56 and 58 of active region 54 are equal. In this way, quantum well layer 60 is positioned centrally in active area 54, with quantum well layer 60, being at a standing wave antinode.

Next, contact region 72 is formed by disposing p-type doped gallium phosphide on stack 68 of distributed Bragg reflectors. Contact region 72 is formed approximately 800–1200 Å thick, more specifically contact region 72 is 1000Å thick. Gallium phosphide is a wide band-gap material, that is transparent to the wavelength of this particular embodiment. Gallium phosphide is easily doped with a p-type dopant, such as magnesium, zinc, or a combination of magnesium and zinc, to a level of 1E19 cm$^{-3}$ or higher. In addition, gallium phosphide is not degraded by the high temperatures in which the doping typically requires, such as 700° C., and is capable of serving as a good passivation layer. There is no need for a cap layer in the preferred embodiment of VCSEL 40 of the present invention.

By now it should be appreciated that a novel article and method for making the article have been disclosed. A light emitting device now can be fabricated to include a doped contact layer, in which the device structure is not degraded during the fabrication process. The light emitting device generates light that has color in the visible spectrum. Additionally, since the fabrication of the contact layer is integrated in the process flow of the light emitting device, the light emitting device is highly manufacturable, thus reducing overall costs and allowing significant improvements in reliability and quality.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A visible emitting vertical cavity surface emitting laser comprising:

a supporting substrate having a surface;

a first stack of distributed Bragg reflectors disposed on the surface of the supporting substrate, the first stack of distributed Bragg reflectors including pairs of alternating layers, wherein each pair of alternating layers includes a layer containing an n-doped aluminum arsenide material and a layer containing an n-doped aluminum gallium arsenide material;

a first cladding region disposed on the first stack of distributed Bragg reflectors;

an active region disposed on the first cladding region;

a second stack of distributed Bragg reflectors disposed on the second cladding region, the second stack of distributed Bragg reflectors including pairs of alternating layers, wherein each pair of alternating layers includes a layer containing a p-doped aluminum arsenide material and a layer containing a p-doped aluminum gallium arsenide material; and a one-half wavelength contact layer including a gallium phosphide material disposed on the second stack of distributed Bragg reflectors.

2. A visible emitting vertical cavity surface emitting laser as claimed in claim 1 wherein the supporting substrate is comprised of a semiconductor material.

3. A visible emitting vertical cavity surface emitting laser as claimed in claim 2 wherein the semiconductor material includes gallium arsenide.

4. A visible emitting vertical cavity surface emitting laser as claimed in claim 2 wherein the pairs of alternating layers in the first stack of distributed Bragg reflectors includes one to fifty pairs of layers.

5. A visible emitting vertical cavity surface emitting laser as claimed in claim 1 wherein the active region defines multiple quantum wells and includes a plurality of barrier layers and at least one quantum well layer.

6. A visible emitting vertical cavity surface emitting laser as claimed in claim 5 wherein the plurality of barrier layers includes an indium gallium aluminum phosphide material.

7. A visible emitting vertical cavity surface emitting laser as claimed in claim 5 wherein the quantum well layer includes an indium gallium phosphide material.

8. A visible emitting vertical cavity surface emitting laser as claimed in claim 2 wherein the pairs of alternating layers in the second stack of distributed Bragg reflectors includes one to fifty pairs of layers.

9. A visible emitting vertical cavity surface emitting laser as claimed in claim 1 wherein the one-half wavelength contact layer of gallium phosphide material is doped with magnesium.

10. A visible emitting vertical cavity surface emitting laser as claimed in claim 1 wherein the one-half wavelength contact layer of gallium phosphide material is doped with zinc.

11. A visible emitting vertical cavity surface emitting laser as claimed in claim 1 wherein the one-half wavelength contact layer of gallium phosphide material is doped with zinc and magnesium.

12. A visible emitting vertical cavity surface emitting laser as claimed in claim 1 wherein the one-half wavelength contact layer of gallium phosphide material is between 800 Å and 1200 Å thick.

13. A visible emitting vertical cavity surface emitting laser comprising:

a semiconductor supporting substrate having a surface;

a first stack of distributed Bragg reflectors disposed on the surface of the semiconductor supporting substrate, the first stack of distributed Bragg reflectors having pairs of alternating layers with a first layer in each pair including a n-doped aluminum arsenide material and a second layer in each pair including a n-doped aluminum gallium arsenide material;

a first cladding region disposed on the first stack of distributed Bragg reflectors;

an active region disposed on the first cladding region, the active region having a quantum well layer, a first barrier layer and a second barrier layer with the quantum well layer positioned between the first barrier layer and the second barrier layer;

a second cladding region disposed on the active region;

a second stack of distributed Bragg reflectors disposed on the second cladding region, the second stack of distributed Bragg reflectors including pairs of alternating layers with each pair including a layer of a p-doped aluminum arsenide material and a layer of a p-doped aluminum gallium arsenide material;

and a one-half wavelength contact layer disposed on the second stack of distributed Bragg reflectors, the one-half wavelength contact layer including a gallium phosphide material.

14. A visible emitting vertical cavity surface emitting laser as claimed in claim 13 wherein the semiconductor supporting substrate is comprised of a gallium arsenide material.

15. A visible emitting vertical cavity surface emitting laser as claimed in claim 13 wherein the one-half wavelength gallium phosphide contact layer is p-type doped to a level of $1E19$ $cm^{-3}$ or higher.

16. A visible emitting vertical cavity surface emitting laser as claimed in claim 15 wherein the one-half wavelength gallium phosphide contact layer is doped with one of a magnesium material, a zinc material, and a combination of a magnesium material and a zinc material.

17. A visible emitting vertical cavity surface emitting laser as claimed in claim 16 wherein the one-half wavelength gallium phosphide contact layer is between 800 Å and 1200 Å thick.

18. A visible emitting vertical cavity surface emitting laser as claimed in claim 17 wherein the one-half wavelength gallium phosphide contact layer is 1000 Å thick.

19. A method of fabricating a visible emitting vertical cavity surface emitting laser comprising the steps of:

providing a semiconductor supporting substrate having a surface;

disposing a first stack of distributed Bragg reflectors on the surface of the semiconductor substrate, forming the first stack of distributed Bragg reflectors to include pairs of alternating layers, with a first layer in each pair including a n-doped aluminum arsenide material and a second layer in each pair including a n-doped aluminum gallium arsenide material and positioning the pairs of alternating layers adjacent the surface of the semiconductor supporting substrate;

disposing a first cladding region on the first stack of distributed Bragg reflectors;

disposing an active region on the first stack of distributed Bragg reflectors;

disposing a second cladding region on the active region;

disposing a second stack of distributed Bragg reflectors on the second cladding region, forming the second stack of distributed Bragg reflectors to include pairs of alternating layers, wherein the pairs of alternating layers include layers of a p-doped aluminum arsenide material and a p-doped aluminum gallium arsenide material, and positioning the pairs of alternating layers adjacent a surface of the active region; and disposing a one-half wavelength contact layer of a gallium phosphide material on the second stack of distributed Bragg reflectors.

20. A method of fabricating a visible emitting vertical cavity surface emitting laser as claimed in claim 19 wherein the step of providing a semiconductor supporting substrate includes providing a gallium arsenide supporting substrate.

21. A method of fabricating a visible emitting vertical cavity surface emitting laser as claimed in claim 19 wherein the step of disposing an active region on the first stack of distributed Bragg reflectors includes the step of forming the active region to define at least two barrier layers and a multiple quantum well layer.

22. A method of fabricating a visible emitting vertical cavity surface emitting laser as claimed in claim 19 wherein the step of disposing a one-half wavelength contact layer of a gallium phosphide material includes the step of forming the one-half wavelength contact layer of gallium phosphide to be magnesium doped and 1000 Å thick.

23. A method of fabricating a visible emitting vertical cavity surface emitting laser comprising the steps of:

providing a gallium arsenide semiconductor supporting substrate having a surface;

disposing a first stack of distributed Bragg reflectors on the gallium arsenide semiconductor supporting substrate, forming the first stack of distributed Bragg reflectors to include pairs of alternating layers of a n-doped aluminum arsenide material and a n-doped aluminum gallium arsenide material, and positioning the pairs of alternating layers adjacent the first stack of distributed Bragg reflectors;

disposing a first cladding region on the first stack of distributed Bragg reflectors, the first cladding region including an indium aluminum phosphide material;

disposing an active region on first cladding region;

disposing a second cladding region on the active region, the second cladding region including an indium aluminum phosphide material;

disposing a second stack of distributed Bragg reflectors on the second cladding region, forming the second stack of distributed Bragg reflectors to include pairs of alternating layers of a p-doped aluminum arsenide material and a p-doped aluminum gallium arsenide material, and positioning the pairs of alternating layers adjacent the second cladding region; and disposing a magnesium doped gallium phosphide one-half wavelength contact layer on a surface of the second stack of distributed Bragg reflectors.

24. A method of fabricating a visible emitting vertical cavity surface emitting laser as claimed in claim 23 wherein the step of disposing a magnesium doped gallium phosphide one-half wavelength contact layer includes the step of forming the one-half wavelength contact layer to be 1000 Å thick.

* * * * *